United States Patent
Kai

(10) Patent No.: US 7,699,934 B2
(45) Date of Patent: Apr. 20, 2010

(54) EPITAXIAL WAFER PRODUCTION APPARATUS AND SUSCEPTOR STRUCTURE

(75) Inventor: Hidemasa Kai, Omura (JP)

(73) Assignee: Sumco Techxiv Corporation, Omura-shi (JP)

(*) Notice: Subject to any disclaimer, the term of this patent is extended or adjusted under 35 U.S.C. 154(b) by 81 days.

(21) Appl. No.: 10/626,675

(22) Filed: Jul. 25, 2003

(65) Prior Publication Data

US 2004/0144323 A1 Jul. 29, 2004

(30) Foreign Application Priority Data

Jul. 29, 2002 (JP) ............................. 2002-220027

(51) Int. Cl.
*H01L 21/00* (2006.01)
*C23C 14/00* (2006.01)
*C23C 16/00* (2006.01)

(52) U.S. Cl. .................. 118/728; 118/725; 118/730; 156/345.51; 156/345.52; 156/345.53; 156/345.55

(58) Field of Classification Search .................. 118/725, 118/724, 728, 500; 156/345.51, 345.52, 156/345.53; 204/298.01, 192.1; 219/444.1; 206/710, 711, 712; 392/418
See application file for complete search history.

(56) References Cited

U.S. PATENT DOCUMENTS 6,099,652 A * 8/2000 Patten et al. ................. 118/724
6,454,865 B1 * 9/2002 Goodman et al. ........... 118/728

FOREIGN PATENT DOCUMENTS

| EP | 0434227 A1 * | 6/1991 |
| JP | 10-223545 | 8/1998 |
| JP | 2000-260851 A | 9/2000 |
| JP | 2001-053030 A | 2/2001 |

OTHER PUBLICATIONS

Notification of Reason for Refusal Patent Application No. 2002-220027 Dispatch Date Jun. 3, 2006.

* cited by examiner

*Primary Examiner*—Ram N. Kackar
(74) *Attorney, Agent, or Firm*—Westerman, Hattori, Daniels & Adrian, LLP

(57) ABSTRACT

A susceptor structure capable of discharging the atmosphere containing dopant species and filling a wafer pocket, without causing a large quantity of a raw material gas to flow from the front surface side of a susceptor to under the susceptor. The susceptor having an approximately round disk shape and having a concave wafer pocket on the front surface thereof for accommodating a wafer, comprises a gas inlet notch passing through from a side surface or a rear surface of the susceptor to the wafer pocket, and a gas discharge notch passing through from the wafer pocket to the side surface or the rear surface of the susceptor. A carrier gas is introduced from the gas inlet notch of the susceptor into the wafer pocket, as shown by arrow b and the gas present inside the wafer pocket is discharged from the gas discharge notch, as shown by arrow c, by using the rotation of the susceptor during epitaxial film growth.

4 Claims, 17 Drawing Sheets

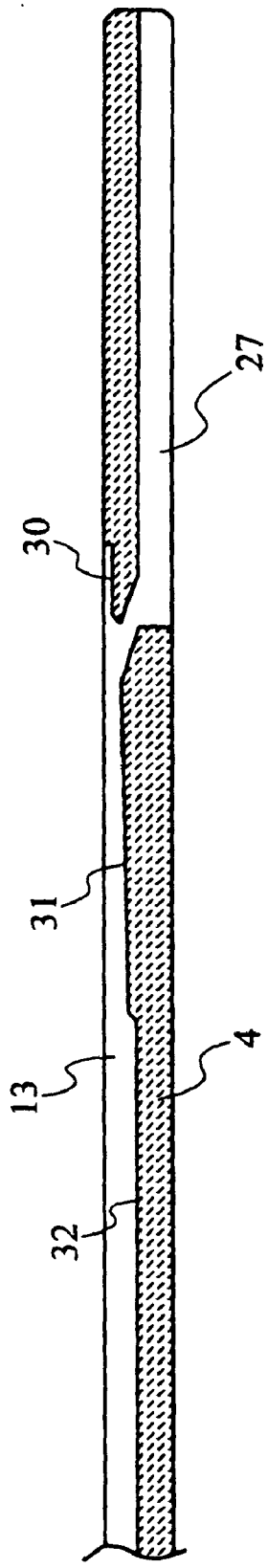
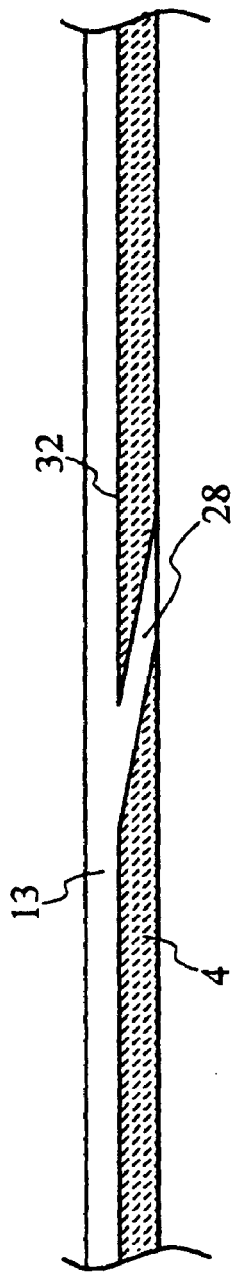
FIG.12A SECTIONAL VIEW ALONG A-A'
FIG.12B SECTIONAL VIEW ALONG C-C'

EPITAXIAL WAFER PRODUCTION APPARATUS AND SUSCEPTOR STRUCTURE

BACKGROUND OF THE INVENTION

1. Field of the Invention

The present invention relates to an epitaxial wafer production apparatus, a susceptor structure, and an epitaxial wafer production method for the formation of an epitaxial layer on a wafer, and more particularly to an epitaxial wafer production apparatus, a susceptor structure, and an epitaxial wafer production method capable of suppressing the increase in dopant concentration in the peripheral edge portion of the front surface of the epitaxial wafer.

2. Description of the Related Art

A technology is known for the production of a silicon wafer which is free from crystal defects and has the desired resistivity by growing a crystal layer of silicon on the front surface of the wafer. For example, in the case of a wafer with a diameter of 200 mm and a thickness of 0.75 mm, such a silicon crystal layer is an ultra-thin layer with a thickness of about several microns. It is generally called an epitaxial layer, and an apparatus for forming the epitaxial layer called an epitaxial wafer production apparatus. Epitaxial wafer production apparatuses of a single wafer processing type, in which silicon wafers were processed one by one, have been used most often because of high quality of the film produced and easiness of film thickness control.

As shown in FIG. 1, in the epitaxial wafer production apparatus of a single wafer processing type, a susceptor 4 (wafer support) supporting one wafer horizontally is usually provided inside a treatment chamber 2. Further, a lift mechanism for moving a wafer 12 up and down with respect to the susceptor 4 is provided for transporting the wafer 12 on the susceptor 4. The lift mechanism comprises a plurality of lift pins 23 extending through the susceptor 4. The wafer 12 is carried on the upper ends of those lift pins 23, and the wafer 12 is lifted or lowered by moving the lift pins 23 up and down with respect to the susceptor 4. With such a lift mechanism, the wafer 12 carried by the hand of a transport arm and into the chamber 2 is moved on the susceptor 4 or, conversely, transferred from the susceptor 4 to the hand.

Further, the wafer 12 supported on the susceptor 4 has to be heated at a high temperature to grow an epitaxial film. For this reason, heat sources 8, 9 such as a plurality of halogen lamps (IR lamps) are arranged above and below the treatment chamber 2 to heat the susceptor 4 and the wafer 12.

The susceptor 4 is prepared by coating a silicon carbide SiC film on a carbon C substrate and plays a role of a liner base maintaining a uniform temperature over the entire wafer 12 when the wafer 12 is heated. As shown in FIG. 2, a recess called a wafer pocket, which is larger in size than the wafer 12 and has a depth of about 1-2 mm is formed in the upper surface of the susceptor 4 to accommodate, for example, a silicon wafer. The inner surface of the wafer pocket 13 has a tapered configuration so as to be in contact only with the outer peripheral portion of the wafer, and measures are taken to minimize the surface contact of the wafer 12 and the inner surface of the wafer pocket 13. An epitaxial layer composed of a silicon thin film is grown on the surface of the wafer 12 by accommodating the wafer 12 inside the wafer pocket 13 and holding the susceptor 4 in a carrier gas containing a raw material gas at the prescribed temperature. The raw material gas as referred to herein is a silicon source gas and a dopant gas.

A chlorosilane gas such as trichlorosilane $SiHCl_3$ or dichlorosilane $SiH_2Cl_2$ is usually used as the silicon gas, and diborane (P type) and phosphine (N type) are usually used as the dopant gas. Those gases are introduced into the chamber together with hydrogen $H_2$ as a carrier gas, and HCl is produced as a byproduct in the course of silicon epitaxy by a thermal CVD reaction on the front surface of the wafer. Therefore, though silicon epitaxy proceeds on the front surface of the wafer, a Si—H—Cl atmosphere is formed on the rear surface of the wafer by an overflow mainly caused by gas diffusion, and emission of dopant species from the rear surface of the wafer occurs in the Si—H—Cl atmosphere.

As a result, the atmosphere comprising dopant species and filling the wafer pocket 13 overflows onto the front surface of the wafer by diffusion, and the dopant concentration in the gas phase locally increases in the outer edge portion of the front surface of the wafer 12. As a result, an effect can be observed of the dopant concentration in the epitaxial layer being increased in the peripheral edge portion of the front surface of the wafer.

In order to prevent the above-described overflow of the atmosphere comprising dopant species and filling the wafer pocket 13 onto the front surface of the wafer, in accordance with the invention described in Japanese Patent Application Laid-open No. 10-223545, a hole 50 passing to the rear surface of the susceptor 4 is provided in the outermost peripheral portion of the wafer pocket 13, as shown in FIG. 16. Thus providing a hole 50 passing from the front surface to the rear surface of the susceptor 4 in the outermost peripheral portion of the wafer pocket 13 makes it possible to prevent the overflow of the atmosphere comprising dopant species and filling the wafer pocket 13 onto the front surface of the wafer 12 because the carrier gas containing the raw material gas and flowing on the front surface side of the susceptor 4 outflows to under the susceptor 4 through the hole 50.

According to the invention described in Japanese Patent Application Laid-open No. 10-223545, when the gas is caused to outflow from the front surface side of the susceptor 4 to under the susceptor 4, the raw material gas such as trichlorosilane $SiHCl_3$ or dichlorosilane $SiH_2Cl_2$, which has a high reactivity, and HCl and amorphous Si obtained by decomposition in a gas phase flow out in a large amount together with the carrier gas into a lower chamber 7b.

Referring to FIG. 1, it is clear that the lower chamber 7b comprises a rotary drive mechanism, a lift mechanism, and a transport arm advancement channel for the wafer 12 and is very difficult to clean. The above-described introduction of the raw material gas and decomposition products results in a significant increase in maintenance time and causes a decrease in productivity. Further, the increase in maintenance cost also cannot be ignored.

Furthermore, because heating is also conducted by the heat source 9 from the side of the lower chamber 7b, contamination of the chamber inner wall degrades the uniformity and reproducibility of heating of the susceptor 4 and also causes a spread in the wafer quality.

The invention of the present application was created to resolve the above-described problems, and it is an object of the present invention to provide an epitaxial wafer production apparatus and a susceptor structure capable of discharging the atmosphere containing dopant species and filling the wafer pocket, without causing the flow of a large quantity of the raw material gas from the front surface side of the susceptor to under the susceptor.

Further, it is another object of the invention of the present application to provide an epitaxial wafer production apparatus and an epitaxial wafer production method which make it difficult for the raw material gas to flow from the front surface side of the susceptor to under the susceptor.

SUMMARY OF THE INVENTION

In order to attain the above-described objects, a first aspect of the invention provides a susceptor of an approximately round disk shape, having a concave wafer pocket on a front surface thereof for accommodating a wafer, comprising: a gas supply channel passing through from a side surface or a rear surface of the susceptor to the wafer pocket; and a gas discharge channel passing through from the wafer pocket to the side surface or the rear surface of the susceptor.

A second aspect of the invention provides the susceptor according to the first aspect, wherein the gas supply channel has a shape adapted to supply a gas into the wafer pocket as the susceptor rotates; and the gas discharge channel has a shape adapted to discharge the gas present in the wafer pocket as the susceptor rotates.

A third aspect of the provides an epitaxial wafer production apparatus comprising: a chamber having a gas supply vent and a gas discharge vent; a susceptor of an approximately round disk shape, which is disposed inside the chamber and comprises a concave wafer pocket on the front surface thereof for accommodating a wafer, a gas supply channel passing through from a side surface or a rear surface to the wafer pocket, and a gas discharge channel passing through from the wafer pocket to the side surface or the rear surface; support means for supporting the susceptor; and heating means for heating the susceptor and the wafer inside the chamber.

A fourth aspect of the invention provides the epitaxial wafer production apparatus according to the third aspect, comprising a gas supply vent for supplying a carrier gas containing a raw material gas only to above the susceptor located inside the chamber.

A fifth aspect of the invention provides an epitaxial wafer production apparatus comprising: a chamber; a susceptor disposed inside the chamber and comprising a concave wafer pocket on a front surface thereof for accommodating a wafer; support means for supporting the susceptor; and heating means for heating the susceptor and the wafer inside the chamber, wherein the apparatus further comprises: a gas supply vent for supplying a carrier gas containing a raw material gas to above the susceptor located inside the chamber; and a heavy gas supply vent for supplying a gas which is heavier than the carrier gas to under the susceptor located inside the chamber.

A sixth aspect of the invention provides a method for producing an epitaxial wafer, comprising the steps of placing a wafer into a concave wafer pocket formed on a front surface of a susceptor disposed inside a chamber; supplying a gas from under the susceptor into the wafer pocket; discharging a gas present inside the wafer pocket from under the susceptor; and heating the susceptor and the wafer inside the chamber.

A seventh aspect of the invention provides a method for producing an epitaxial wafer, comprising the steps of placing a wafer onto a susceptor disposed inside a chamber; supplying a carrier gas containing a raw material gas to above the susceptor inside the chamber and supplying a gas heavier than the carrier gas to under the susceptor; and heating the susceptor and the wafer inside the chamber.

With the susceptor structure of the present invention, the atmosphere containing dopant species and filling the wafer pocket can be discharged without causing a large quantity of the raw material gas to flow from the front surface side of the susceptor to under the susceptor.

Further, with the susceptor structure of the present application, because the gas present inside the wafer pocket is forcibly discharged by using the rotation of the susceptor during epitaxial growth, the atmosphere containing the dopant species and filling the wafer pocket can be more effectively prevented from overflowing to the front surface of the wafer.

Furthermore, forming the gas inlet notches and the gas discharge notches so that they have symmetrical shapes makes it possible to discharge forcibly the gas present in the wafer pocket when the susceptor is rotated either in the clockwise direction or in the counterclockwise direction.

With the epitaxial wafer production apparatus of the present application, supplying into the lower chamber a gas heavier than the carrier gas supplied into the upper chamber makes it possible to fill the lower chamber with the heavy gas and to prevent the carrier gas and the raw material gas from flowing into the lower chamber from the upper chamber. As a result, the atmosphere containing dopant species and filling the wafer pocket can be discharged without causing a large quantity of the raw material gas to flow from the front surface side of the susceptor to under the susceptor.

BRIEF DESCRIPTION OF THE DRAWINGS

FIG. 12A is a cross-sectional view of the susceptor shown in FIG. 10 along A-A';

FIG. 12B is a cross-sectional view of the susceptor shown in FIG. 10 along C-C';

DESCRIPTION OF THE PREFERRED EMBODIMENTS

The preferred embodiments of the invention of the present application will be described hereinbelow in greater detail based on FIGS. 1-15 and FIG. 17.

[Explanation of the Entire Apparatus]

Figure 1:
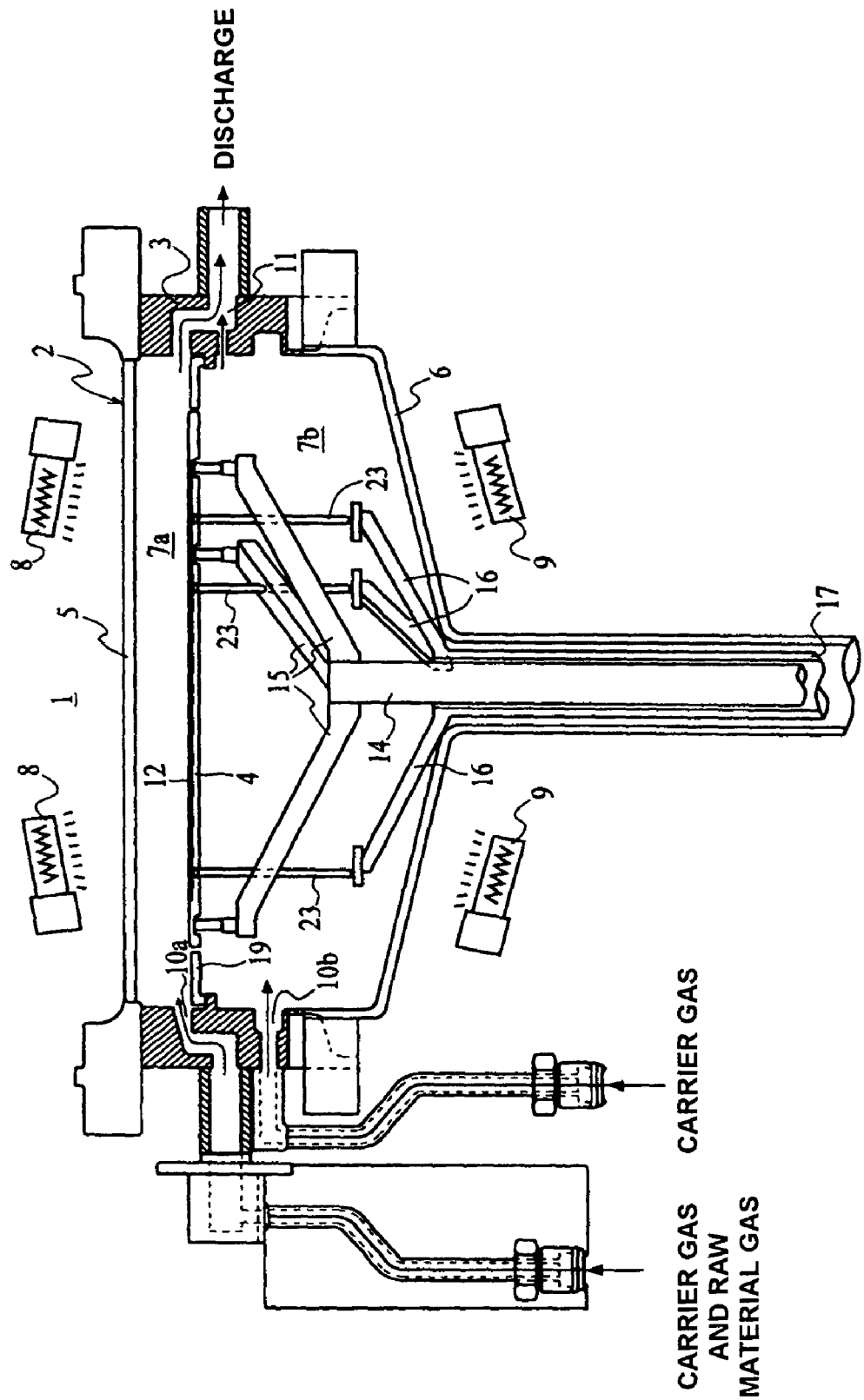
FIG. 1 is a longitudinal sectional view illustrating schematically the epitaxial wafer production apparatus in accordance with the present application.

FIG. 1 is a longitudinal sectional view illustrating a schematic structure of an epitaxial wafer production apparatus 1 in accordance with the present invention. The schematic structure itself of the epitaxial wafer production apparatus 1 in accordance with the present invention is almost identical to that of the epitaxial wafer production apparatus explained with reference to the prior art technology. Therefore, the explanation will be conducted by using the same figure. In the figure, the structure of the chamber 2 is mainly described, and specific drawing of a rotary drive mechanism is omitted.

In the chamber 2, a cylindrical base ring 3 is sandwiched from above and below by a disk-like upper window 5 and a saucer-like lower window 6, and the internal closed space forms a reaction furnace. Transparent quartz is used for the upper window 5 and lower window 6 so as to avoid shielding of the light from the heat sources. The reaction furnace formed inside the chamber 2 is divided into an upper chamber 7a which is the space above the wafer 12 and a lower chamber 7b which is the space below the wafer 12.

Further, the heat sources 8, 9 for heating the reaction furnace are provided above and below the chamber 2. In the present embodiment, each of the upper and lower heat sources 8, 9 is composed of a plurality of halogen lamps (IR lamps).

A susceptor 4 for supporting in the upper part thereof the wafer 12 is accommodated in the chamber 2. The susceptor 4 has a round disk-like shape, if viewed from above, the diameter thereof being larger than that of the wafer 12. A round concave wafer pocket 13 for accommodating the wafer 12 is provided in the upper surface of the susceptor 4. In the present example, the susceptor 4 is prepared by coating a silicon carbide SiC film on a carbon C substrate and plays a role of a liner base maintaining a uniform temperature over the entire wafer 12 when the wafer 12 is heated. For this purpose, the susceptor 4 has a thickness and a thermal capacity several times those of the wafer 12.

In order to form a homogeneous epitaxial layer on the upper surface of the wafer 12, the susceptor 4 rotates about the vertical axis as a rotation center in the plane parallel to the sheet plate of the wafer 12 in the course of the epitaxial layer growing operation. The center of the wafer pocket 13 provided in the susceptor 4 obviously coincides with the rotation center of the susceptor 4.

A susceptor support shaft 14 in the shape of a cylindrical rod or tube, which serves as a rotation shaft of the susceptor 4, is disposed vertically below the susceptor 4, and three susceptor arms 15 supporting the susceptor 4 horizontally are provided above the susceptor support shaft 14. The three susceptor arms 15 are arranged radially so as to form an angle of 120° therebetween, if viewed from above, and the upward protrusions provided on the distal ends of the susceptor arms 15 are abutted against the lower surface of the susceptor 4 and support the susceptor 4.

The susceptor support shaft 14 is disposed vertically in the position such that the axial center thereof coincides with the center of the round disk of the susceptor 4, and the susceptor 4 is rotated by the rotation of the susceptor support shaft 14. The rotation is provided to the susceptor support shaft 14 from a rotary drive mechanism (not shown in the figures). Transparent quartz is used for the susceptor support shaft 14 and the susceptor arms 15 so as to avoid shielding of the light from the heat source 9.

Figure 2:
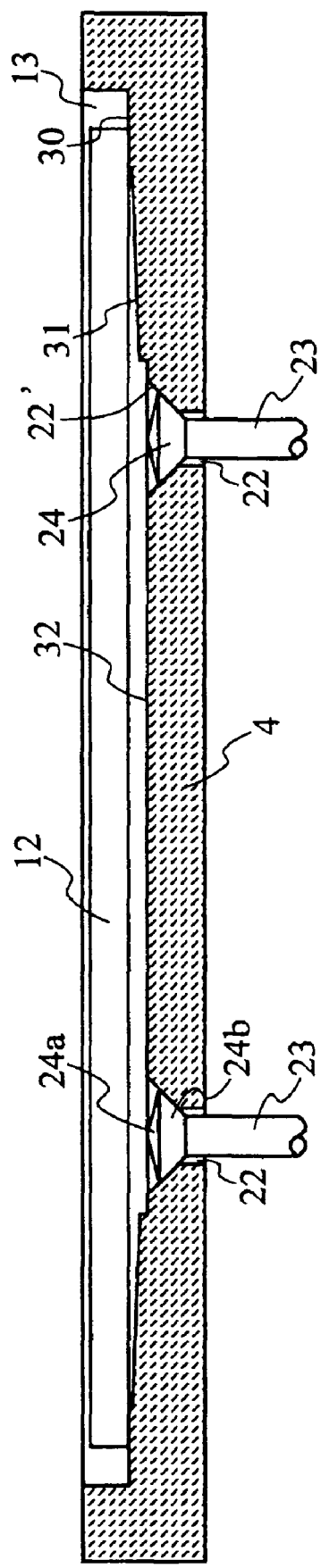
FIG. 2 is a longitudinal sectional view illustrating schematically a susceptor.

A longitudinal section of the susceptor 4 is shown schematically in FIG. 2. The wafer pocket 13 of the susceptor 4 is composed of a plurality of step-like portions and a tapered surface, as described hereinbelow. For example, in the apparatus for epitaxial growth of wafers with a diameter of 300 mm, a round disk-like member with a diameter of 350-400 mm and a thickness of 3-6 mm is used as the susceptor 4.

A first step-like portion 30 in the form of a round concave portion is provided in the position at a distance of 20-40 mm from the outer periphery of the upper surface of the susceptor 4 toward the center. The first step-like portion 30 is a round flat surface provided in a position 0.4-0.7 mm below the upper surface of the susceptor 4 and is a horizontal surface, that is, parallel to the upper surface of the susceptor 4.

Furthermore, a tapered surface 31 with a gentle inclination is provided starting from the position at a distance of 5-6 mm from the outer periphery of the first step-like portion 30 toward the center. The tapered surface 31 starts from a position about 0.1 mm further below the first step-like portion 30 and forms a funnel shape with a very gentle slope toward the center, the gradient of descending being about 0.1 mm over a distance of 24-27 mm.

A second step-like portion 32 in the form of a round concave portion is provided further toward the center from the tapered surface 31. The second step-like portion 32 is a round flat surface provided in a position of about 0.3 mm below the tapered surface 31 and is a horizontal surface, that is, parallel to the upper surface of the susceptor 4.

Three through orifices 22 (only two orifices are shown in FIG. 2, for convenience of explanation) are provided in the second step-like portion 32, and dish-like orifices 22' expanding upward are formed above each through orifice 22. The lift pin 23 for supporting a wafer is inserted in each of the three through orifices 22. The diameter of the through orifice 22 is larger than the diameter of the lift pin 23 and the orifice is formed so as to have a size such that the lift pin 23 moves up and down with respect to the susceptor 4, without coming into contact therewith The lift pins 23 are composed of quartz, silicon Si, silicon carbide SiC, or quartz coated with a thin film of silicon Si or silicon carbide SiC. The lift pin 23 has a round rod- or tube-like shape and a head portion 24 is provided at the upper end thereof, the head portion having a tapered surface 24b on the lower outer periphery thereof which corresponds to the dish-like orifice 22'. The taper angle of the tapered surface 24b of the head portion 24 matches the taper angle of the tapered surface of the dish-like orifice 22'. As a result, the head portion 24 provides excellent sealing with respect to the inner wall of the dish-like orifice 22', thereby preventing leakage of the raw material gas through the space between the lift pin 23 and the inner wall of the through orifice 22.

The upper part 24a of the head portion 24 has a conical shape with an obtuse vertical angle, thereby greatly reducing the contact surface area when supporting the rear surface of the wafer. As a result, the occurrence of damage of the rear surface of the wafer by the lift pins 23 is prevented. The head portion 24 of the lift pin 23 mates with the inner wall of the dish-like orifice 22' of the susceptor 4, and when the lift pin 23 is lowered, it hangs down vertically under gravity. In this state, the upper part 24a of the head portion 24 does not protrude from the upper surface of the second step-like portion 32.

As shown in FIG. 1, the lift pin 23 hangs down from the susceptor 4 and the body thereof is inserted into the through orifice provided in the susceptor arm 15. Because the lift pin 23 is an independent unit structure separated from the below-described lift arm 16, when the susceptor 4 rotates, the lift pin 23 also rotates together with the susceptor 4, but the lift arm 16 maintains a stationary state. Because the body of the lift pin 23 is inserted into the through orifice provided in the susceptor arm 15, when the susceptor 4 rotates, the lift pin 23 can be prevented from being tilted by a centrifugal force.

A cylindrical lift shaft 17 with an inner diameter allowing the shaft to slide with respect to the susceptor support shaft 14 is provided on the outer periphery of the susceptor support shaft 14. Three lift arms 16 arranged radially so as to form an angle of 120° therebetween, if viewed from above, are provided at the upper end of the lift shaft 17. When the lift pins 23 are lowered and the epitaxial growth process is implemented, the lower ends of the lift arms 16 and lift pins 23 maintain a contactless state and no excess load is applied by the lift arms 16 to the lift pins 23 during the rotation of the susceptor 4.

When the wafer 12 is lifted from the susceptor 4, the rotation of the susceptor 4 is terminated in the position in which the lift pins 23 are aligned with the lift arms 16, and the lift arms 16 are lifted or the susceptor support shaft 14 is lowered. As a result, the lower ends of the lift pins 23 are brought into contact with the lift arms 16, the head portions 24 of the lift pins 23 are lifted from the susceptor 4, and the wafer 12 is pushed up from below by the heads 24 and lifted from the wafer pocket 13.

As shown in FIG. 1, a heat-sink ring 19 in the form of a round ring with a thickness almost equal to that of the susceptor 4 is fixedly arranged so as to surround the susceptor 4 on the outer periphery of the susceptor 4. The inner peripheral surface of the heat-sink ring 19 is disposed at a certain distance from the outer peripheral surface of the susceptor 4 so as to prevent contact therebetween. The susceptor 4 can rotate independently from the heat-sink ring 19. Similarly to the susceptor 4, the heat-sink ring 19 is fabricated by coating a film of silicon carbide SiC on a carbon C substrate and serves to prevent rapid temperature changes accompanying changes in thermal capacity in the outer peripheral portion of the susceptor 4. Providing the heat-sink ring 19 around the susceptor 4 in the above-described manner makes it possible to heat the susceptor 4 almost uniformly from the central portion to the outer peripheral portion thereof.

As shown in FIG. 1, a gas supply vent 10a and a gas discharge vent 11 are provided in the base ring 3. The carrier gas containing the raw material gas is supplied through the gas supply vent 10a shown on the left side and discharged from the gas discharge vent 11 shown on the right side of this figure. The raw material gas and the carrier gas are supplied into the chamber 2 through the gas supply vent 10a from the gas supply unit (not shown in the figure) provided outside the chamber.

The gas supply vent 10a has an opening above the heat-sink ring 19 in the inner peripheral surface of the base ring 3 and supplies hydrogen gas $H_2$ or hydrogen gas containing the raw material gas into the upper chamber 7a. The raw material gas is prepared by adding a dopant gas of diborane (P type) or phosphine (N type) to a chlorosilane-type silicon source gas such as trichlorosilane $SiHCl_3$ or dichlorosilane $SiH_2Cl_2$. Those gases are introduced into the upper chamber 7a together with hydrogen gas $H_2$ which is the carrier gas.

Furthermore, the lower supply vent 10b is provided separately from the gas supply vent 10a, and hydrogen gas $H_2$ is supplied into the lower chamber 7b through the lower supply vent 10b from a gas supply unit (not shown in the figure) provided outside the chamber. The lower supply vent 10b has an opening below the heat-sink ring 19 in the inner peripheral surface of the base ring 3 and supplies hydrogen gas $H_2$ into the lower chamber 7b.

Thus supplying the raw material gas only into the upper chamber 7a makes it possible to prevent unnecessary reactions of the raw material gas in the lower chamber 7b.

The gas discharge vent 11 has two openings, above and below the heat-sink ring 19, in the inner peripheral surface of the base ring 3 and discharges the gas from both the upper chamber 7a and the lower chamber 7b to the outside of the chamber 2.

First Embodiment

The susceptor structure of the first embodiment will be described hereinbelow in greater detail with reference to FIGS. 3 to 7.

Figure 3:
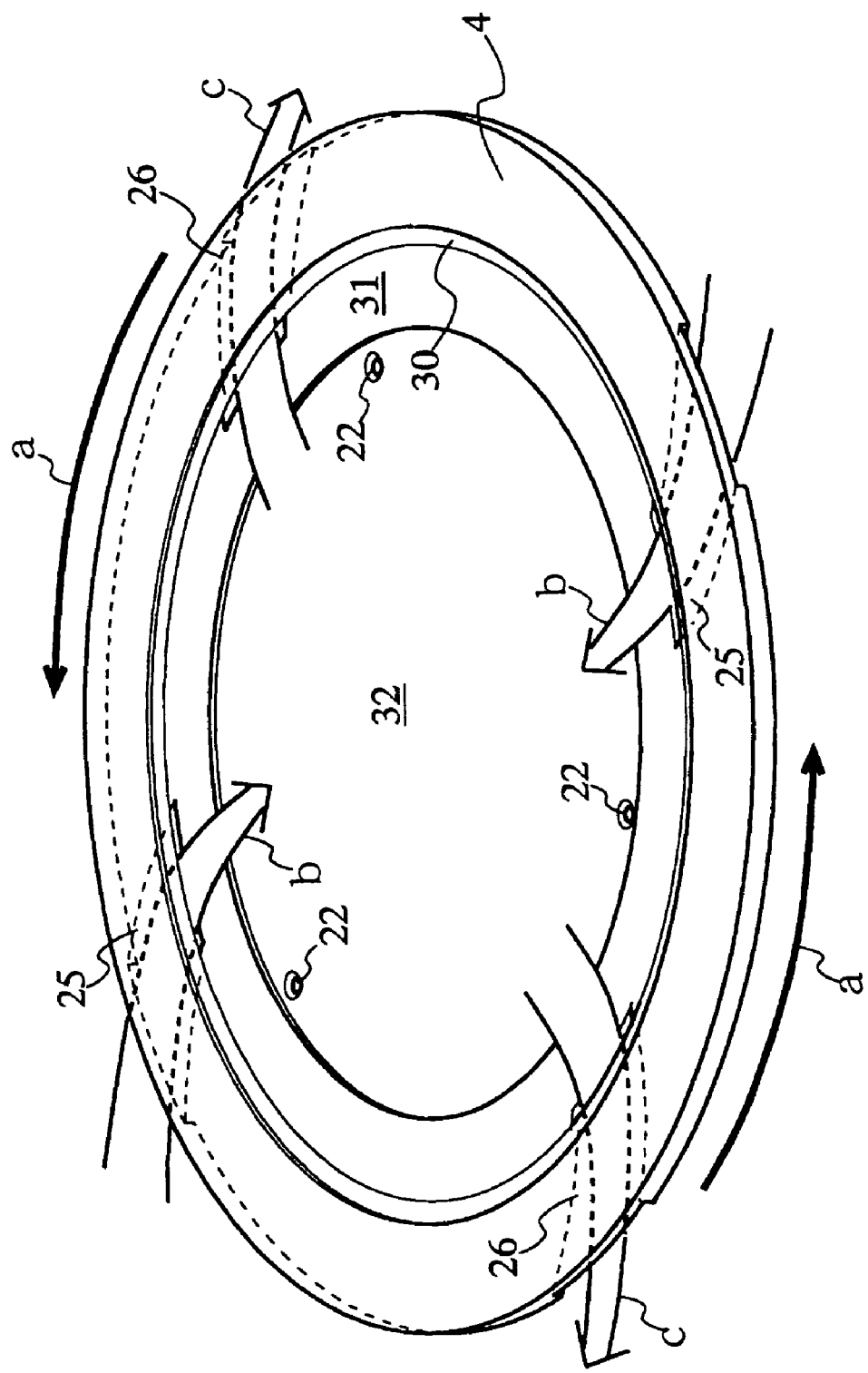
FIG. 3 is a perspective view of the front surface side of the susceptor of the first embodiment.
Figure 4:
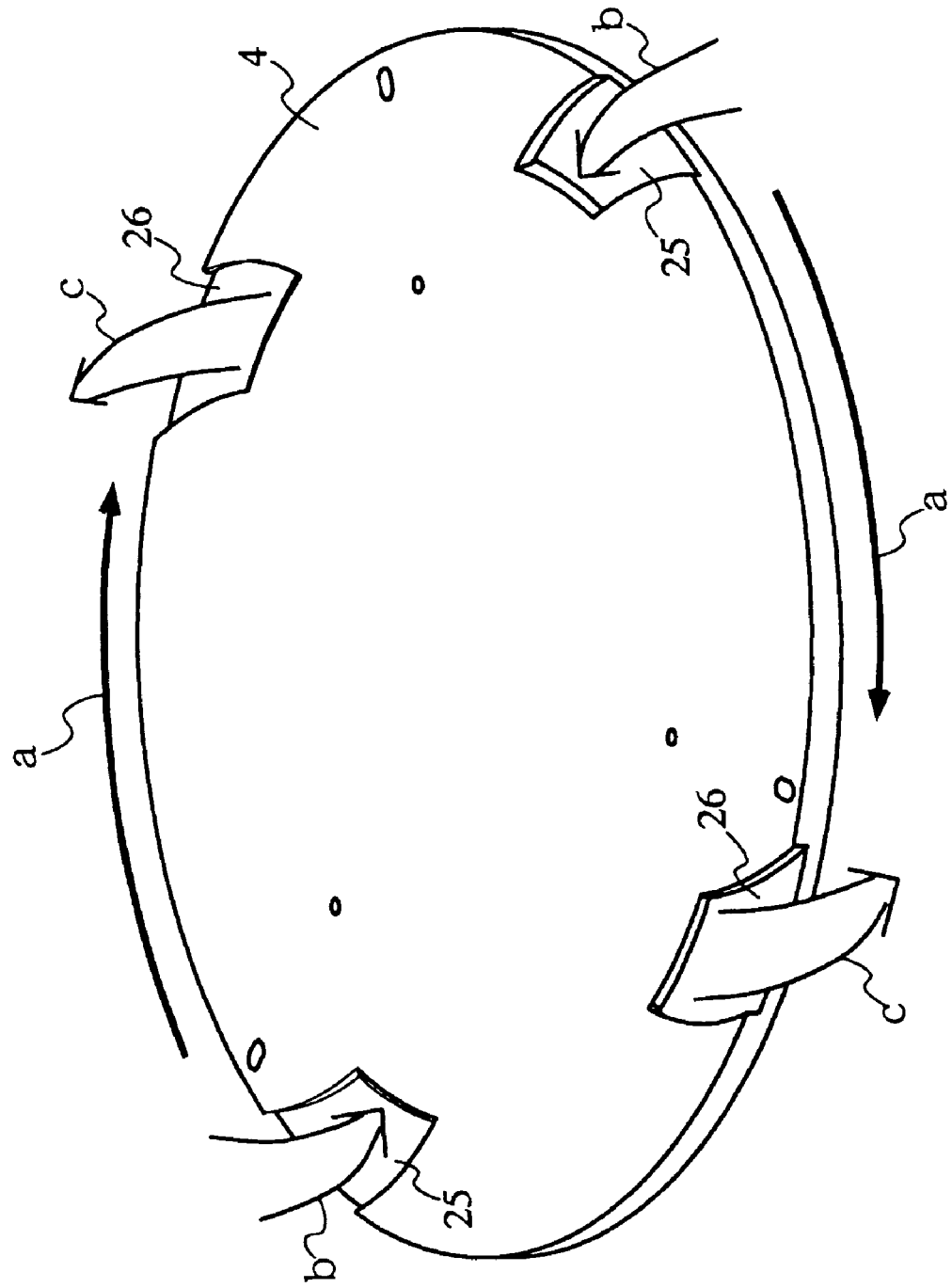
FIG. 4 is a perspective view of the rear surface side of the susceptor of the first embodiment.

FIG. 3 is a perspective view of the front surface side of the susceptor 4. FIG. 4 is a perspective view of the rear surface side of the susceptor 4. As shown in FIG. 3 and FIG. 4, the susceptor 4 is provided with four notches passing from the rear surface side of the susceptor 4 and reaching the middle of the susceptor 4. Each notch has a rectangular opening in the outer peripheral surface of the susceptor 4. Of the four notches, the notches disposed in the positions symmetrical with respect to the center of the susceptor 4 form pairs. Thus, two gas inlet notches 25 and two gas discharge notches 26 are formed. As shown in FIG. 4, the gas inlet notches 25 and gas discharge notches 26 form wide grooves which draw gentle curves, if viewed from the rear surface side of the susceptor 4. The cross-sectional shape of the groove preferably narrows from the outer periphery of the susceptor 4 toward the central part of the susceptor 4, but also may be constant.

Figure 5:
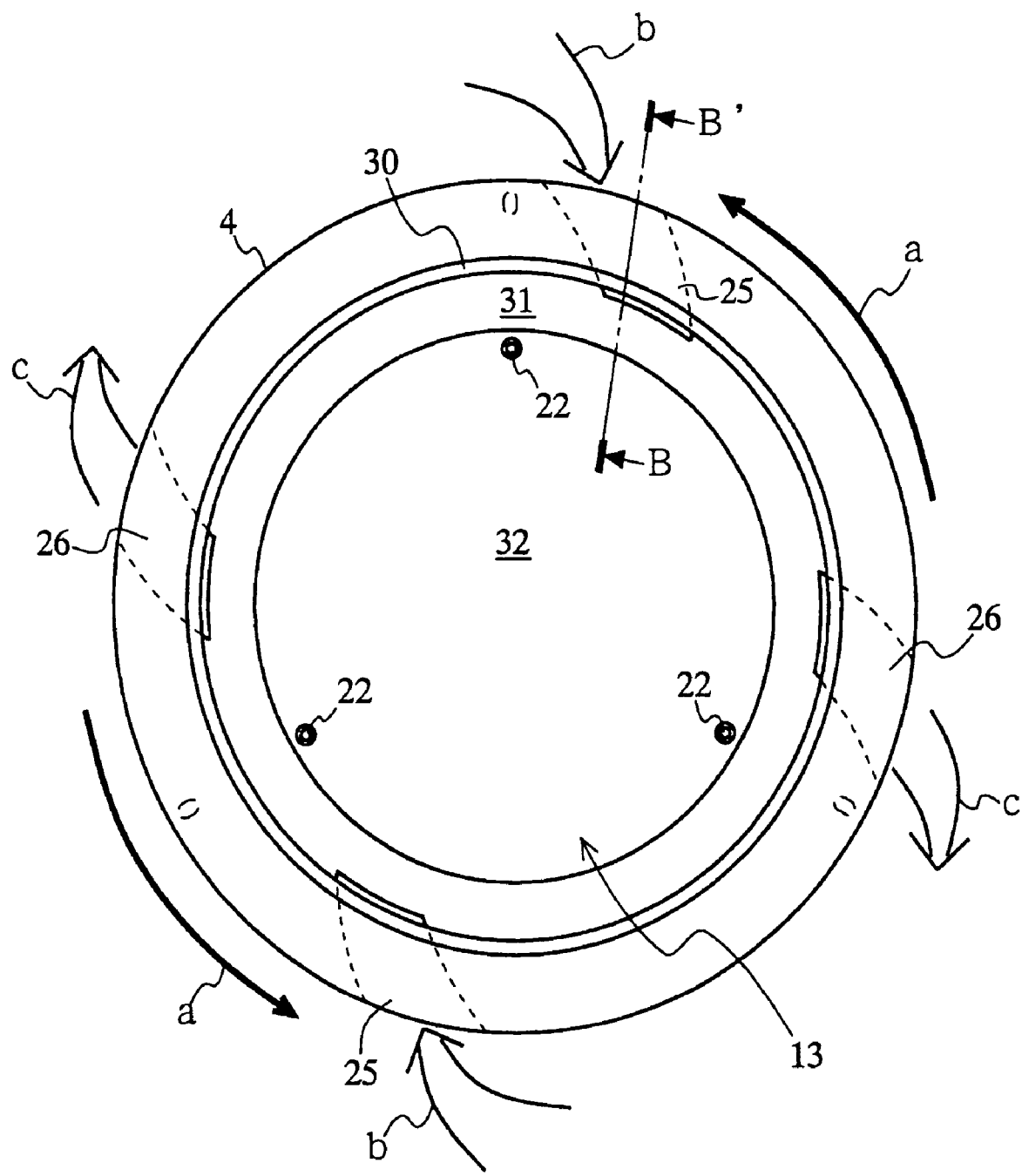
FIG. 5 is a plan view of the susceptor of the first embodiment.
Figure 6:
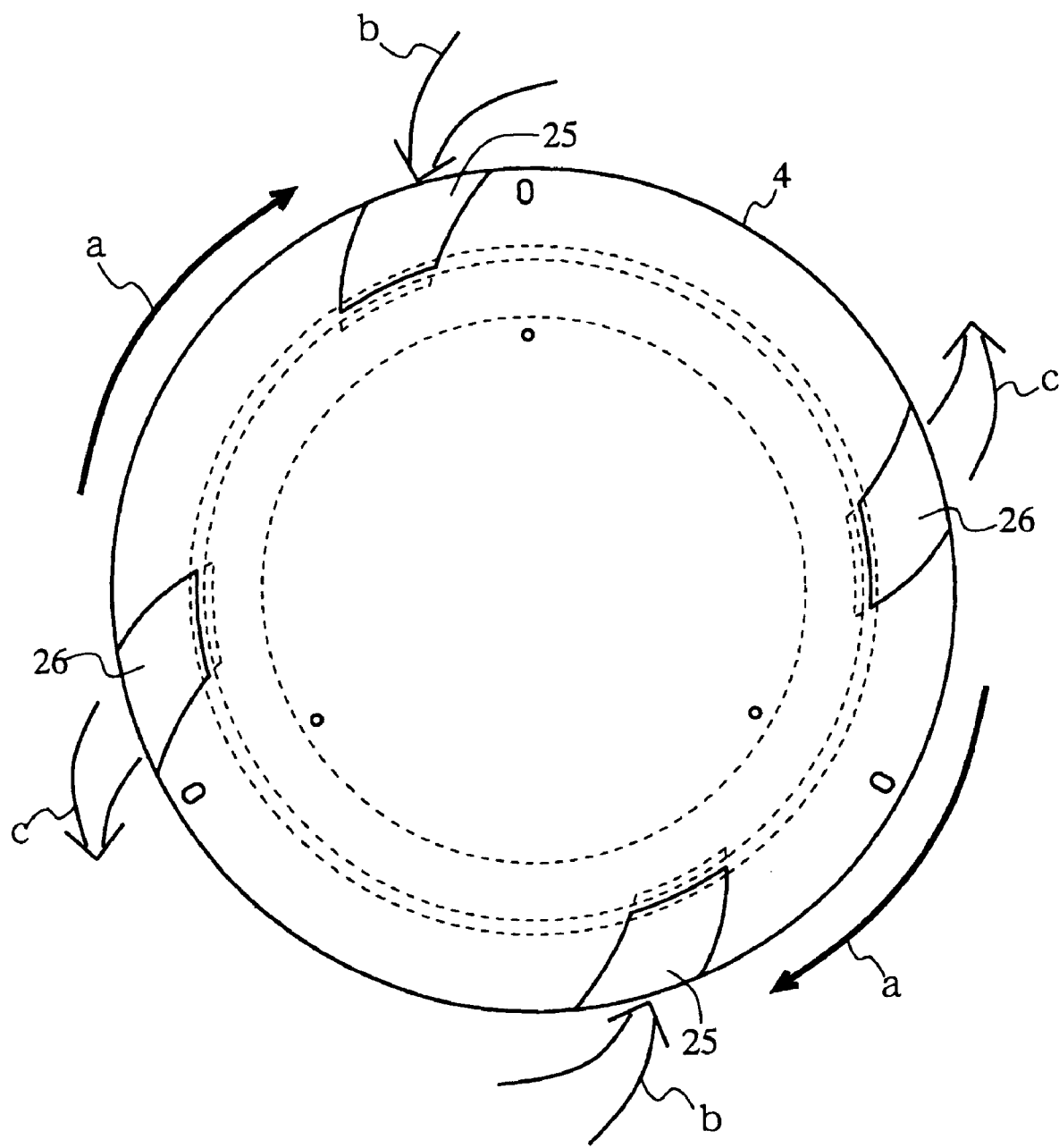
FIG. 6 is a bottom view of the susceptor of the first embodiment.

FIG. 5 is a plan view of the susceptor 4, and FIG. 6 is a bottom view of the susceptor 4. As shown in FIG. 5, the gas inlet notches 25 are formed so as to whirl clockwise toward the center, and the gas discharge notches 26 are formed so as to whirl clockwise toward the outer side.

Figure 7:
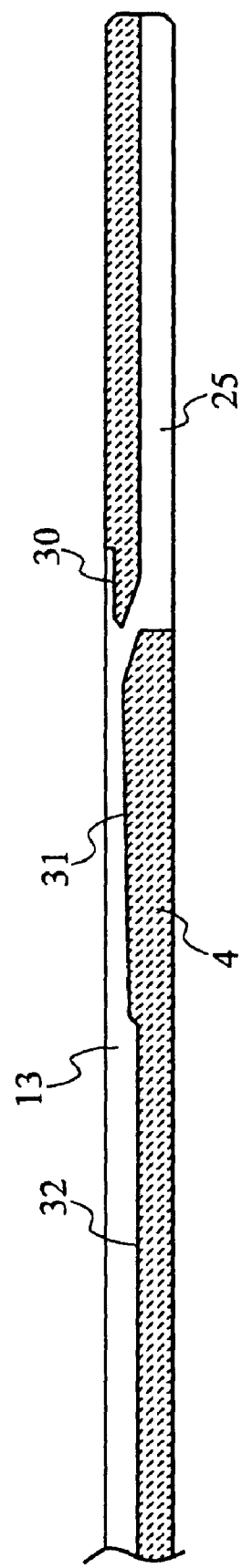
FIG. 7 is a cross-sectional view of the susceptor shown in FIG. 5 along B-B'.

FIG. 7 is a cross-sectional view along B-B' in FIG. 5. Because the gas inlet notches 25 and gas discharge notches 26 have identical cross-sectional shape, only the cross-sectional shape of the gas inlet notches 25 will be explained herein. As shown in FIG. 7, the gas inlet notches 25 form grooves in the direction toward the center from the outer peripheral surface of the susceptor 4 to the initiation position of the tapered surface 31. Further, they pass through the susceptor 4 at an inclination of 10-45° and form an opening in the tapered surface 31. More preferably, they pass through the susceptor 4 at an angle of 20°. As a result, a groove is formed in the rear surface of the susceptor 4, this groove drawing a curve from the outer peripheral surface of the susceptor 4 toward the center thereof and penetrates into the wafer pocket 13 by entering through the tapered surface 31.

As shown by arrows a in FIG. 3, the susceptor 4 rotates counterclockwise, if viewed from above. As a result, the carrier gas present inside the lower chamber 7b flows into the wafer pocket 13 from the gas inlet notches 25 of the susceptor 4, as shown by arrows b, and the gas present inside the wafer pocket 13 is discharged from the gas discharge notches 26, as shown by arrows c. Thus, the carrier gas flows in from the rear surface side of the susceptor 4 through the gas inlet notches 25, circulates inside the wafer pocket 13, and is discharged to the rear surface side of the susceptor 4 through the gas discharge notches 26.

Therefore, with the susceptor 4 of the first embodiment, the atmosphere containing dopant species which diffuses from the rear source of the wafer in the process of epitaxial growth can be discharged from the wafer pocket 13, without causing a large quantity of the raw material gas to flow from the front surface side of the susceptor 4 to under the susceptor 4.

Further, because the gas present inside the wafer pocket 13 is forcibly discharged by using the rotation of the susceptor 4 during epitaxial growth, the atmosphere containing the dopant species and filling the wafer pocket 13 can be more effectively prevented from overflowing to the front surface of the wafer 12. In the present embodiment, a configuration was used in which the gas present in the wafer pocket 13 was forcibly discharged by forming the gas inlet notches 25 and the gas discharge notches 26 as curved grooves. However, the effect of discharging the gas present in the wafer pocket 13 can be also demonstrated even when the notches are not in the form of a curved groove.

Furthermore, with the susceptor 4 of the present embodiment, the gas inlet notches 25 and the gas discharge notches 26 have symmetrical shapes. Therefore, the gas present in the wafer pocket 13 can be also forcibly discharged when the susceptor 4 is rotated either in the clockwise direction or in the counterclockwise direction. For example, when the susceptor is rotated in the direction (clockwise direction) opposite to the counterclockwise direction shown in FIG. 5, the gas inlet notches 25 function for gas discharge, and the gas discharge notches 26 function for gas inlet.

Further, in the present embodiment, an example was shown in which the gas inlet notches 25 and the gas discharge notches 26 passed through from the rear surface side of the susceptor 4 to the tapered surface 31. However, notches of one type of both types may also pass through to the second step-like portion 32. Further, the number of the gas inlet notches 25 and the gas discharge notches 26 can vary depending on the design and at least one of them may be used.

Second Embodiment

Figure 14:
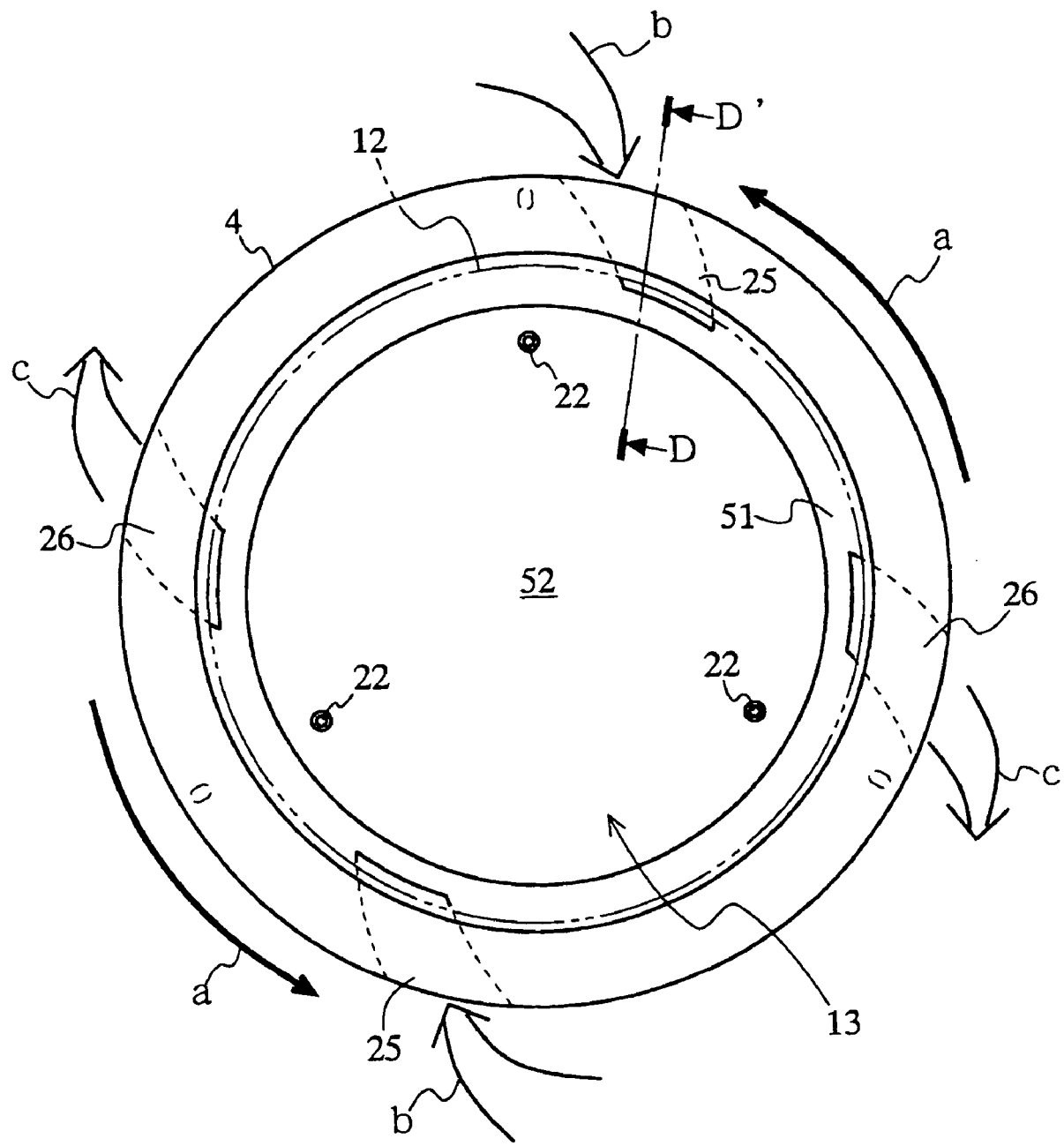
FIG. 14 is a plan view of the susceptor of the second embodiment.
Figure 15:
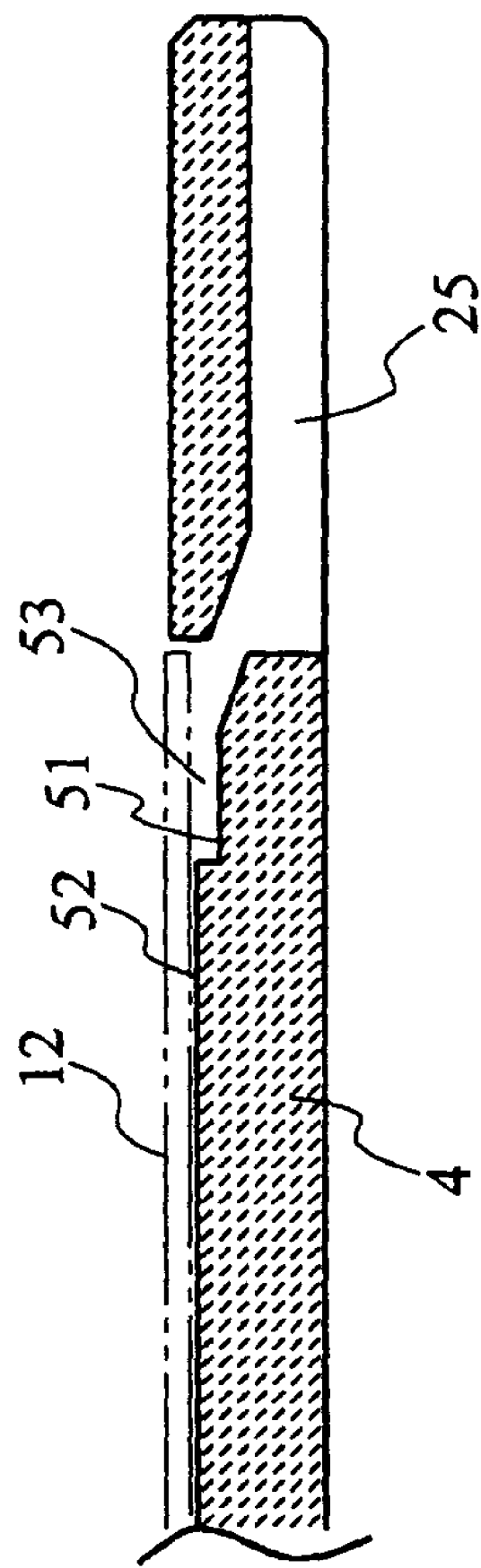
FIG. 15 is a cross-sectional view of the susceptor shown in FIG. 14 along D-D'.
Figure 16:
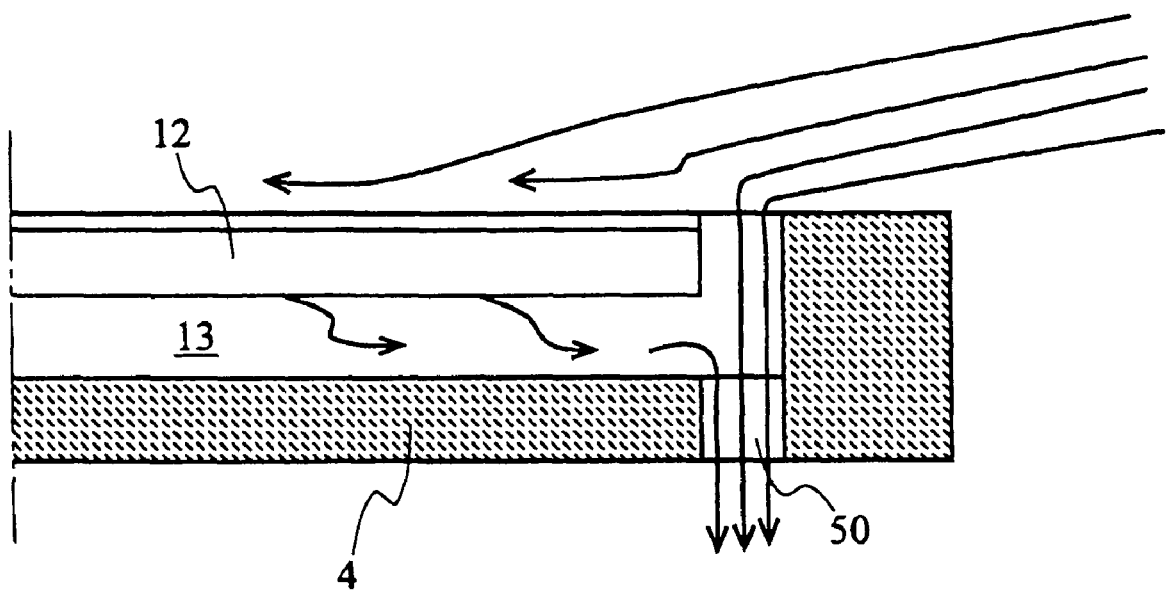
FIG. 16 is a longitudinal sectional view illustrating schematically the conventional susceptor.

FIG. 14 and FIG. 15 illustrate another example. FIG. 14 is a plan view of the susceptor 4 viewed from the upper surface. FIG. 15 is a cross section along D-D'. Because the shape of the rear surface of the wafer is identical to that of the first embodiment, the explanation will be conducted with reference to FIG. 4.

The susceptor 4, similarly to the first embodiment, comprises four notches passing from the rear surface side of the susceptor 4 to the middle of the susceptor 4 in the thickness direction, each notch having a rectangular opening in the outer peripheral surface of the susceptor 4. Of the four notches, the notches disposed in the positions symmetrical with respect to the center of the susceptor 4 form pairs. As shown in FIG. 4, the gas inlet notches 25 and gas discharge notches 26 form wide grooves which draw gentle curves, if viewed from the rear surface side of the susceptor 4. The cross-sectional shape of the groove preferably narrows from the outer periphery of the susceptor 4 toward the central part of the susceptor 4, but also may be constant.

As shown in FIG. 14, the gas inlet notches 25 are formed so as to whirl clockwise toward the center, and the gas discharge notches 26 are formed so as to whirl clockwise toward the outer side.

As shown in FIG. 15, the susceptor 4 of the present embodiment comprises a surface 52 for carrying the wafer 12 and a gas sweeping step-like portion 51 formed in the outer peripheral portion of the surface 52. The surface 52 is obtained by removing part of the upper surface of the susceptor 4 so as to obtain a round concave shape approximately matching that of the wafer 12. The gas sweeping step-like portion 51 is further lowered toward the rear surface side of the wafer from the surface 52 and is a flat surface of a round ring shape provided on the outer periphery of the surface 52. The wafer 12 shown by a two-dot-dash line is placed on the surface 52 formed on the inner side of the gas sweeping step-like portion 51 and is disposed so that the outer peripheral portion thereof covers the gas sweeping step-like portion 51 from above. As a result, a round ring-like space 53 is formed between the wafer 12 and the gas sweeping step-like portion 51. The surface 52 may be subjected to the so-called knurling process forming mesh-like fine shallow grooves.

The cross-sectional shape of the gas inlet notches 25 and the gas discharge notches 26 in the present embodiment will be described below. Because the gas inlet notches 25 and gas discharge notches 26 have identical cross-sectional shape, only the cross-sectional shape of the gas inlet notches 25 will be explained herein. As shown in FIG. 15, the gas inlet notches 25 form grooves in the direction toward the center from the outer peripheral surface of the susceptor 4 to the initiation position of the gas sweeping portion 51. Further, they pass through the susceptor 4 at an inclination of 10-45° and form an opening in the gas sweeping portion 51. More preferably, they pass through the susceptor 4 at an angle of 20°.

As shown by arrows a in FIG. 14, the susceptor 4 rotates counterclockwise, if viewed from above. As a result, the carrier gas present inside the lower chamber 7b of the susceptor 4 flows into the gas sweeping portion 51 from the gas inlet notches 25 of the susceptor 4, as shown by arrows b, and is discharged from the gas discharge notches 26, as shown by arrows c. Thus, the carrier gas flows in from the rear surface side of the susceptor 4 through the gas inlet notches 25, circulates inside the round ring-like space 53, and is discharged to the rear surface side of the susceptor 4 through the gas discharge notches 26.

Therefore, with the susceptor 4 of the second embodiment, the atmosphere containing the dopant species and filling the wafer pocket 13 can be discharged without causing a large quantity of the raw material gas to flow from the front surface side of the susceptor 4 to under the susceptor 4.

Third Embodiment

The structure of the susceptor of the third embodiment will be described hereinbelow in greater detail with reference to FIGS. 8 to 12.

Figure 8:
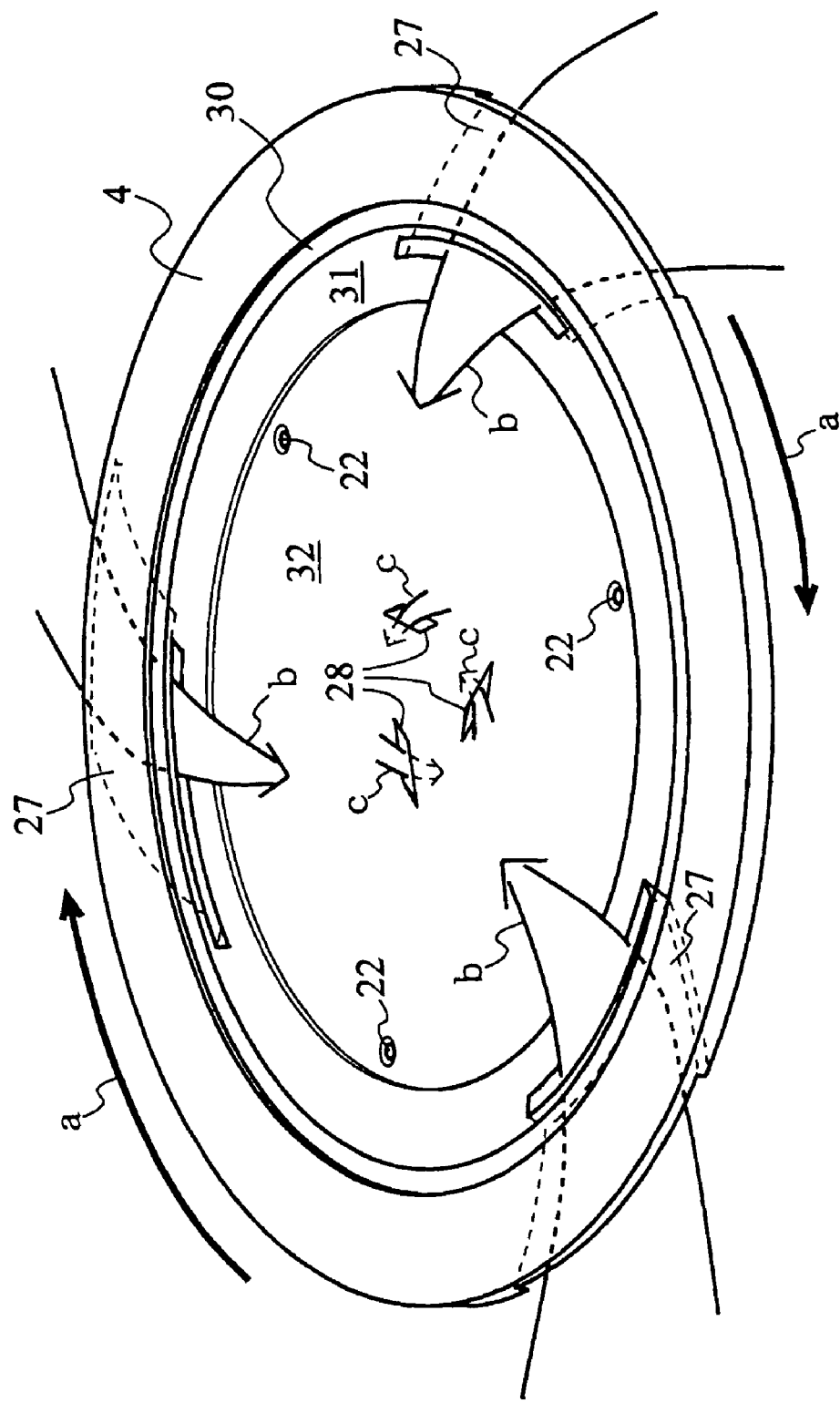
FIG. 8 is a perspective view of the front surface side of the susceptor of the third embodiment.
Figure 9:
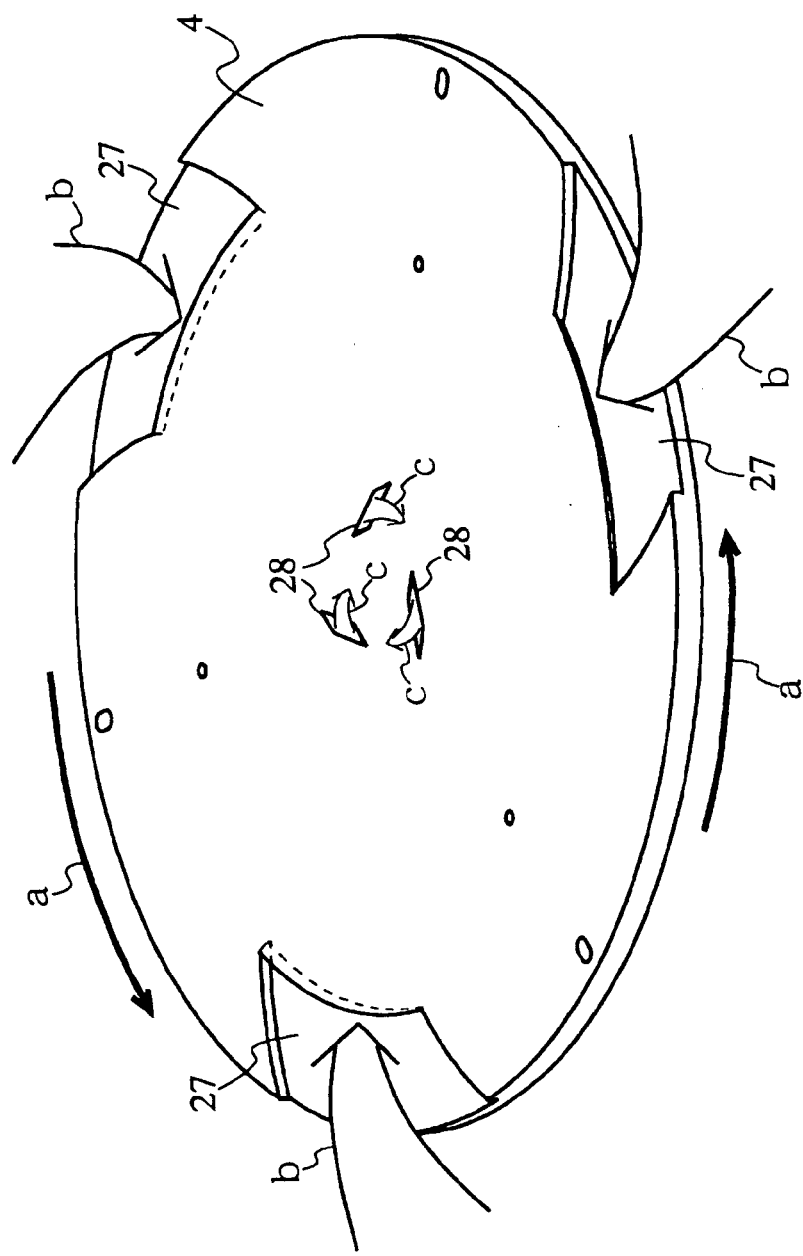
FIG. 9 is a perspective view of the rear surface side of the susceptor of the third embodiment.

FIG. 8 is a perspective view of the front surface side of the susceptor 4. FIG. 9 is a perspective view of the rear surface side of the susceptor 4. As shown in FIG. 8 and FIG. 9, the susceptor 4 comprises three notches passing from the rear surface side of the susceptor 4 to the middle of the susceptor 4 in the thickness direction. Each notch is a gas inlet notch 27 having a rectangular opening in the outer peripheral surface of the susceptor 4. As shown in FIG. 9, the gas inlet notches 27 form wide grooves which draw gentle curves, if viewed from the rear surface side of the susceptor 4. The cross-sectional shape of the groove preferably narrows from the outer periphery of the susceptor 4 toward the central part of the susceptor 4, but also may be constant.

Figure 10:
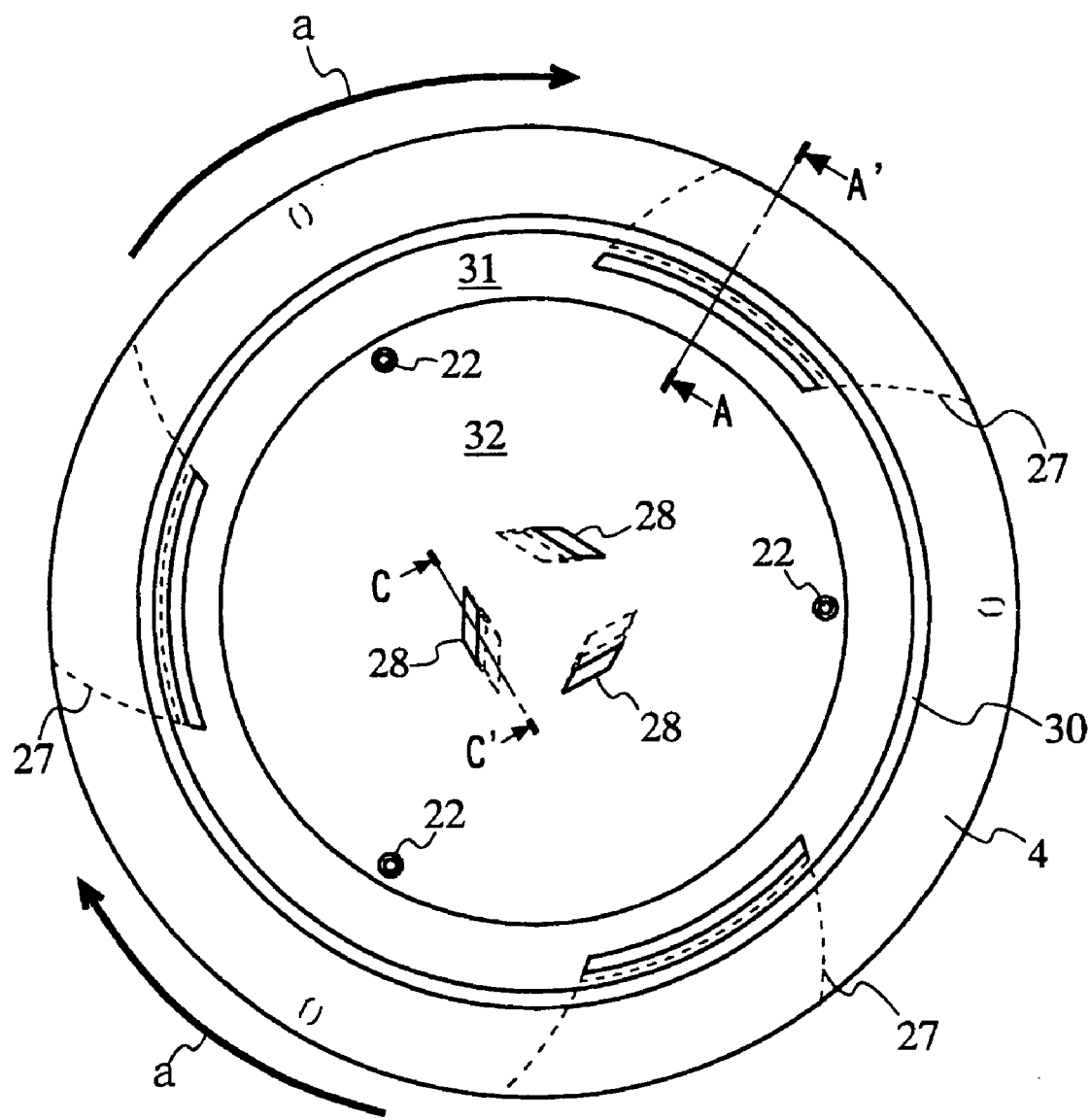
FIG. 10 is a plan view of the susceptor of the third embodiment.
Figure 11:
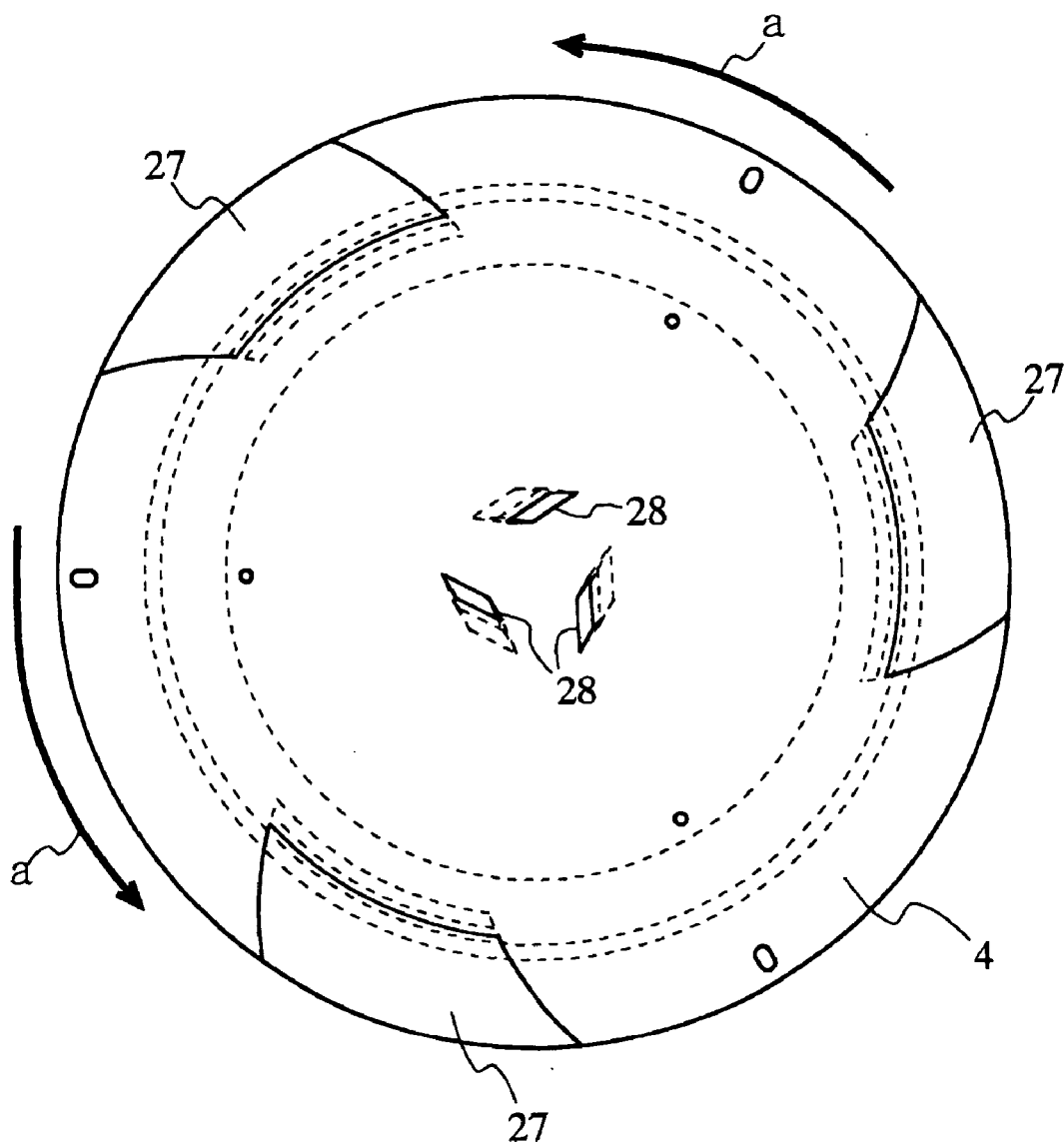
FIG. 11 is a bottom view of the susceptor of the third embodiment.

FIG. 10 is a plan view of the susceptor 4, and FIG. 11 is a bottom view of the susceptor 4. As shown in FIG. 10, because the susceptor 4 rotates clockwise, as shown by arrow a, the gas inlet notches 27 are formed so as to whirl counterclockwise toward the center. The gas inlet notches 27 are provided in the positions obtained by dividing a circle equidistantly, so as to form an angle of 120° therebetween with respect to the center of the susceptor 4.

FIG. 12A is a cross-sectional view along A-A' in FIG. 10. As shown in FIG. 12A, the gas inlet notches 27 form grooves in the direction toward the center from the outer peripheral surface of the susceptor 4 to the initiation position of the tapered surface 31. Further, they pass through the susceptor 4 at an inclination of 10-45° and form an opening in the tapered surface 31. More preferably, they pass through the susceptor 4 at an angle of 20°. As a result, a groove is formed in the rear surface of the susceptor 4, this groove drawing a curve from the outer peripheral surface of the susceptor 4 toward the center thereof and penetrates into the wafer pocket 13 by entering through the tapered surface 31.

As shown in FIG. 10, the susceptor 4 of the present embodiment comprises gas discharge openings 28 passing through the susceptor 4 from the front surface side to the rear surface side thereof in the flat surface of the second step-like portion 32, that is, close to the central part of the susceptor. FIG. 12B is a cross-sectional view along C-C' in FIG. 10. The gas discharge opening 28 has an opening on the upper surface of the second step-like portion 32 of the wafer pocket 13, passes through the susceptor 4 at an inclination of 10-45° and again forms an opening on the rear surface of the susceptor 4. More preferably, it passes through the susceptor 4 at an angle of 20°. The gas discharge opening 28 shown in FIG. 10 has a quadrangular cross-sectional shape, but the cross-sectional shape does not need to be rectangular and may be round or triangular.

As shown by arrows a in FIG. 8, the susceptor 4 rotates clockwise, if viewed from above. As a result, the carrier gas present inside the lower chamber 7b of the susceptor 4 flows into the wafer pocket 13 from the gas inlet notches 27, as shown by arrows b, and the gas present inside the wafer pocket 13 is discharged from the gas discharge openings 28, as shown by arrows c. Thus, the carrier gas flows in from the rear surface side of the susceptor 4 through the gas inlet notches 27, circulates inside the wafer pocket 13, and is discharged to the rear surface side of the susceptor 4 through the gas discharge openings 28.

Therefore, with the susceptor 4 of the third embodiment, the atmosphere containing the dopant species and filling the wafer pocket 13 can be discharged without causing a large quantity of the raw material gas to flow from the front surface side of the susceptor 4 to under the susceptor 4.

Further, because the gas present inside the wafer pocket 13 is forcibly discharged by using the rotation of the susceptor 4 during epitaxial growth, the atmosphere containing the dopant species and filling the wafer pocket 13 can be more effectively prevented from overflowing to the front surface of the wafer 12.

In the present embodiment, an example was shown in which the gas inlet notches 27 passed through from the rear surface side of the susceptor 4 to the tapered surface 31, but they may also pass through to the second step-like portion 32. Further, the number of the gas inlet notches 27 can vary depending on the design and at least one of them may be used.

The configuration does not need to be as described in the first to third embodiments, in particular, with the shape of the wafer pocket 13 being a combination of a step-like portion and a tapered surface, and a configuration comprising only a step-like portion or only a tapered surface, a configuration in which mesh-like fine shallow grooves called knurls are formed and the wafer is supported by contact with a plurality of protrusions, or a configuration in which the surface roughness of silicon carbide coated on the surface is much higher than that of the rear surface of the wafer may be used. The present invention is applicable to any of those configurations and can be used in all the configurations in which a gas is taken from the side or rear surface of the susceptor 4 into the wafer pocket 13 and again discharged from the side or rear surface of the susceptor 4.

Fourth Embodiment

The structure of the susceptor of the fourth embodiment will be described below in greater detail with reference to FIG. 17. The entire configuration of the susceptor of the present embodiment is almost identical to that of the susceptor of the third embodiment shown in FIG. 8. Therefore, identical components will be assigned with the same symbols and the specific explanation thereof will be omitted.

Figure 17:
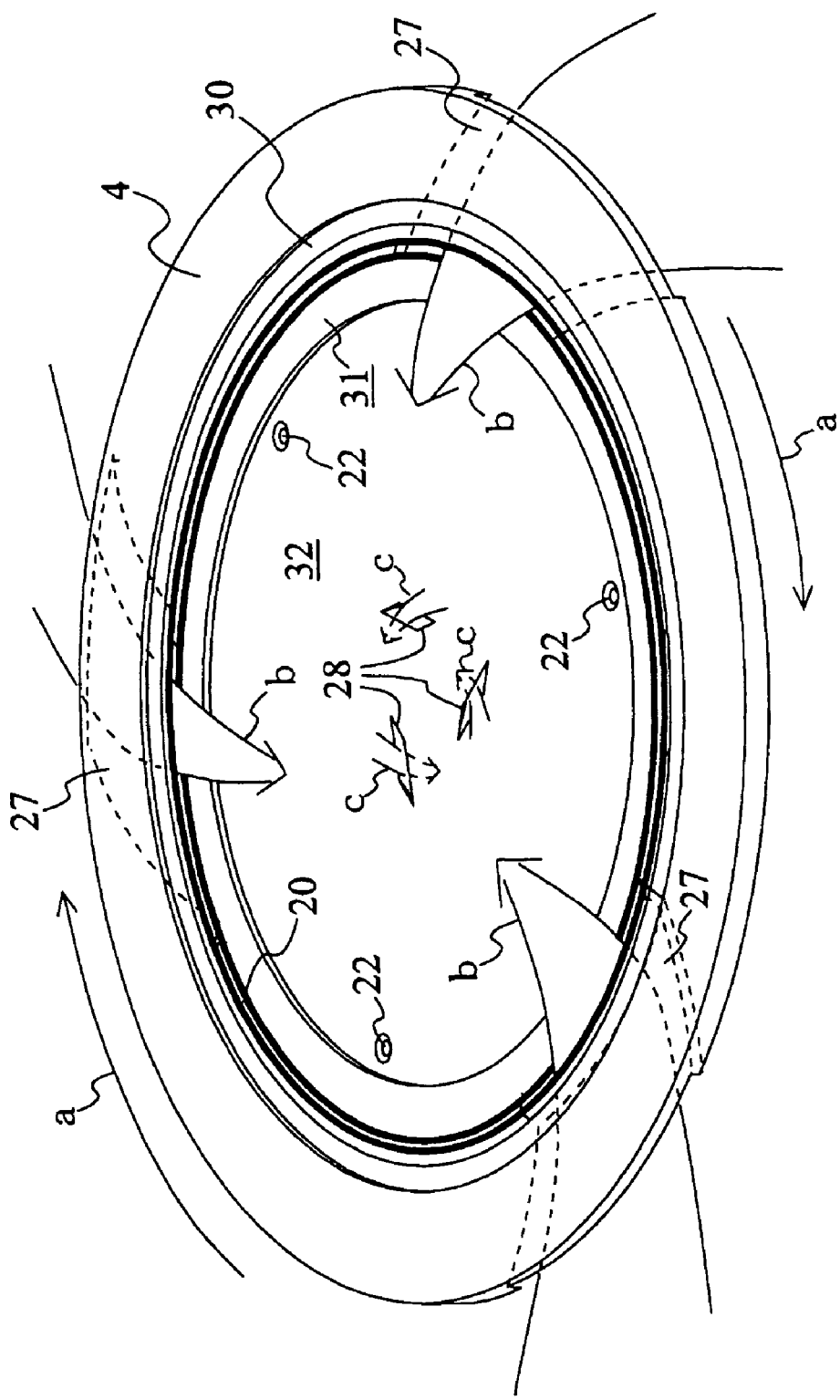
FIG. 17 is a perspective view of the front surface side of the susceptor of the fourth embodiment.

FIG. 17 is a perspective view of the front surface side of a susceptor 4. A specific feature of the susceptor 4 of the present embodiment is that a gas escape groove 20 is provided therein, in particular, as shown by a solid line in FIG. 17. The gas escape groove 20 is a round ring-like shallow groove formed in a tapered surface 31, this groove being formed so as to link together the openings of the gas inlet notches 27 on the side of a wafer pocket 13.

More specifically, the gas escape groove 20 may have a width of 3.0 mm and a depth of about 1.5 mm, but it goes without saying that the groove width may be more than 3.0 mm and the groove depth may be more than 1.5 mm. From the standpoint of increasing the gas discharge efficiency, it is desired that the groove width be no less than 1.0 mm and the groove depth be no less than 0.5 mm.

Forming in the tapered surface 31 such a round ring-like gas escape groove 20 linking together the openings of the gas inlet notches 27 on the side of the wafer pocket 13 makes it possible to increase the gas discharge efficiency in the zone where the gas escape groove 20 is present or to improve the uniformity of gas discharge efficiency in the tangential direction of the wafer.

Further the gas escape groove 20 of the present embodiment can be also formed to have the shape of a round ring linking together the openings of the gas inlet notches 25 and the gas discharge notches 26 in the above-described first embodiment. In this case, too, the gas discharge efficiency in the zone where the groove is present can be increased or the uniformity of gas discharge efficiency in the tangential direction of the wafer can be improved.

The operation of the entire epitaxial wafer production apparatus in accordance with the present invention will be described below with reference to FIG. 1. In the present explanation of operation, the explanation of mechanical operation of the lift mechanism and rotary drive mechanism will be omitted and only the operational and positional relationship of the susceptor, lift pins, and wafer will be explained.

First, the upper and lower heat sources 8, 9 are activated and the susceptor 4 located inside the treatment chamber 2 is heated to the temperature appropriate for the transportation of the wafer. The wafer transportation temperature is preferably about 800° C. and is controlled so as to be maintained within the above-mentioned temperature range, while detecting the temperature of the susceptor 4 located inside the chamber 2, e.g., with a thermal sensor. At the same time, a carrier gas is introduced from the gas supply vent 10a and the lower supply vent 10b, and the upper chamber 7a and the lower chamber 7b are filled with the carrier gas. The chamber 2 has the gas discharge vent 11 on the side opposite the gas supply vent 10a, and the carrier gas constantly flows from the gas supply vent 10a and the lower supply vent 10b toward the gas discharge vent 11. Hydrogen $H_2$ is generally most often used as the carrier gas, and the carrier gas is supplied into the chamber 2 in a normal temperature (room temperature) state.

Once the inside of the chamber 2 has been sufficiently heated and filled with the carrier gas, the wafer 12 is placed into the chamber 2. The wafer 12 is sliced from an ingot and formed into a thin round disk, for example, by a polishing process. For example, the wafer has a diameter of 300 mm and a thickness of about 0.7-0.75 mm. The wafer 12 is placed on a quartz hand and the hand is introduced into the chamber 2. The wafer 12 is transferred on the lifted lift pins 23 and the lift pins 23 are gradually lowered. As a result, the wafer 12 is fit into the wafer pocket 13 of the susceptor 4 and assumes a state in which no displacement occurs in the left-right direction.

The upper and lower heat sources 8, 9 are activated and the wafer surface temperature is raised to the temperature (1000-1200° C.) suitable for epitaxial growth. Further, a rotary drive motor is driven in response to a command from a control unit (not shown in the figures) and the susceptor 4 is rotated. Once the rotation of the susceptor 4 has stabilized, a raw material gas is mixed with the carrier gas and the raw material gas is supplied into the upper chamber 7a via the gas inlet vent 10a. The raw material gas is obtained by adding a dopant gas of diborane (P type) or phosphine (N type) to a chlorosilane-type silicon source gas, mainly such as trichlorosilane $SiHCl_3$ or dichlorosilane $SiH_2Cl_2$.

The carrier gas containing the raw material gas flows to the front surface of the wafer 12 and an epitaxial layer starts to grow on the front surface of the wafer. Because the wafer 12 is rotated in the horizontal plane in a state in which it is accommodated in the susceptor 4, an epitaxial layer of an almost uniform thickness grows on the front surface of the wafer 12. In this process, HCl is produced as a byproduct in the course of silicon epitaxy by a thermal CVD reaction on the front surface of the wafer.

In the conventional apparatuses, silicon epitaxy proceeds on the front surface of the wafer, but because a Si—H—Cl atmosphere remains inside the wafer pocket 13 due to an overflow mainly caused by gas diffusion on the rear surface of the wafer, the emission of dopant species from the rear surface of the wafer is initiated in the Si—H—Cl atmosphere.

As described hereinabove, with the susceptor 4 of the present application, which was explained in the first to fourth embodiments, the rotation during film formation on the front surface of the wafer is used to absorb the carrier gas (hydrogen gas $H_2$ containing no raw material gas) present inside the lower chamber 7b from the side surface or rear surface of the susceptor 4, to cause the circulation thereof inside the wafer pocket 13, and then to discharge it from the side surface or the rear surface of the susceptor 4. The gas is then discharged to the outside of the chamber from the opening located below the gas discharge vent 11. Therefore, the retention of the Si—H—Cl atmosphere inside the wafer pocket 13 can be prevented and the effect of emission of the dopant species from the rear surface of the wafer can be suppressed.

Once the epitaxial layer of the desired thickness has been grown, the supply of the raw material gas is terminated, the heat sources 8, 9 are controlled and the temperature inside the chamber 2 is lowered to the wafer transportation temperature. The treated wafer 12 is taken out of the chamber 2. The taking-out procedure is a reversed taking-in procedure.

Figure 13:
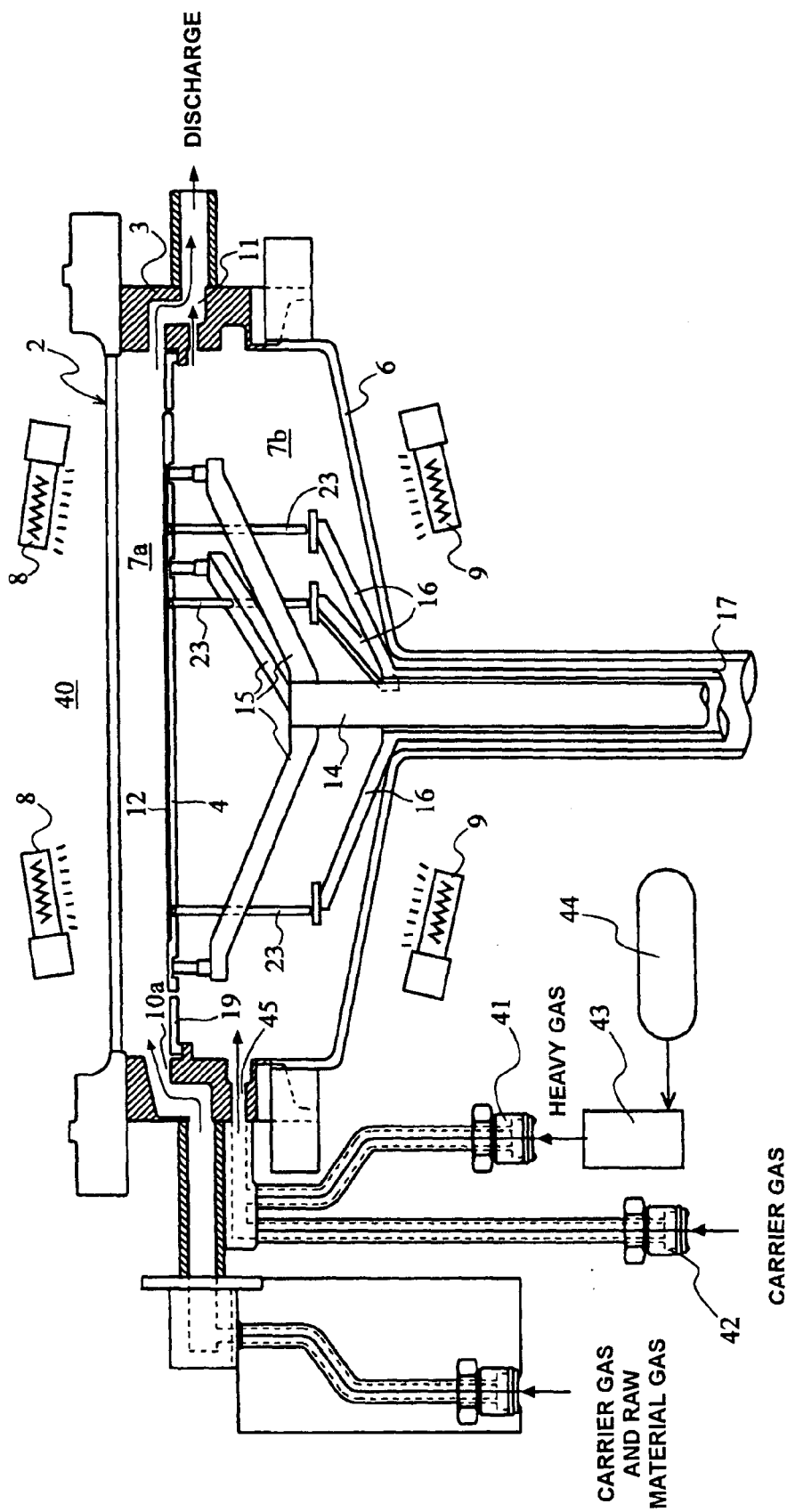
FIG. 13 is a longitudinal sectional view illustrating another example of the epitaxial wafer production apparatus in accordance with the present application.

A modification example of the epitaxial wafer production apparatus of the present application will be described hereinbelow. FIG. 13 is a longitudinal sectional view illustrating a schematic structure of the epitaxial wafer production apparatus 40. The schematic structure of the epitaxial wafer production apparatus 40 itself is almost identical to that of the epitaxial wafer production apparatus 1 explained with reference to FIG. 1. Therefore, identical components will be assigned with the same symbols and the specific explanation thereof will be omitted.

In the epitaxial wafer production apparatus 40, heavy gas supply means 41 and carrier gas supply means 42 are linked to a heavy gas supply vent 45 formed in a base ring 3. A heavy gas source 44 is connected to the heavy gas supply means 41 via flow rate adjustment means 43, and the heavy gas supplied from the heavy gas source 44 is adjusted to the desired supply quantity with the flow rate adjustment means 43. The heavy gas supplied from the heavy gas supply means 41 is mixed with the carrier gas supplied from the carrier gas supply means 42 and is supplied from the heavy gas supply vent 45 to the lower chamber 7b. The supply quantities of the gas supplied from the gas supply vent 10a and the gas supplied from the heavy gas supply vent 45 are controlled by a process controller (not shown in the figures).

The heavy gas supply vent 45 supplies the heavy gas from outside the chamber 2 only into the lower chamber 7b, without intersecting with the gas supply vent 10a. For example, argon gas can be used as the heavy gas. The heavy gas is essentially required to be heavier than the carrier gas supplied to the upper chamber 7a. An argon gas tank or a pipe from an argon gas purification plant can be used as the heavy gas source 44, and a mass flow controller can be used as the flow rate adjustment means 43.

The inside of the lower chamber 7b of the chamber 2 is filled with the heavy gas, e.g., argon gas, supplied from the heavy gas supply vent 45. Because the heavy gas is heavier than the carrier gas supplied into the upper chamber 7a, the inside of the lower chamber 7b is filled with the heavy gas, thereby making it possible to prevent the carrier gas and the raw material gas from flowing into the lower chamber from the upper chamber 7a. As a result, the atmosphere containing dopant species and filling the wafer pocket 13 can be discharged without causing a large quantity of the raw material gas to flow from the front surface side of the susceptor 4 to under the susceptor 4. Further, FIG. 13 illustrates an example in which the heavy gas supply vent 45 supplies a mixture of the carrier gas and the heavy gas, but a carrier gas supply vent and a heavy gas supply vent may be also provided independently.

What is claimed is:

1. A susceptor of an approximately round disk shape, having a concave wafer pocket on a front surface thereof for accommodating a wafer and support arms for supporting a susceptor, comprising:

a gas supply channel; and a gas discharge channel, wherein said gas supply channel comprises an aperture and a groove, wherein the aperture passes through from a rear surface of the susceptor to the wafer pocket and is connected to an inner end of a groove formed on the rear surface of the susceptor while an outer end of the groove extends to a circumferential edge of the susceptor so as to provide gas flow path from the circumferential edge of the susceptor to the wafer pocket, and said gas discharge channel comprises a second aperture and a second groove, wherein the second aperture passes through from the rear surface of the susceptor to the wafer pocket and is connected to an inner end of the groove formed on the rear surface of the susceptor, while the outer end of the groove extends to the circumferential edge of the susceptor so as to provide gas flow path from the wafer pocket to the circumferential edge of the susceptor, wherein the gas supply channel and the gas discharge channel are formed at positions different from a position of the supporting arms.

2. The susceptor according to claim 1, wherein the groove is curved in a rotating direction of the susceptor, when viewed from the inner end defining the groove.

3. The susceptor according to claim 1, wherein a wafer-pocket-side of the first aperture is inwardly defined when viewed from the rear-surface-side opening of the first aperture.

4. The susceptor according to claim 1, wherein a cross-sectional shape of the groove narrows from the outer end to the inner end of the groove.

* * * * *